US012612691B2

(12) United States Patent
Tamura et al.

(10) Patent No.: US 12,612,691 B2
(45) Date of Patent: Apr. 28, 2026

(54) SUBSTRATE HOLDER, SUBSTRATE HOLDING METHOD, AND FILM FORMATION APPARATUS

(71) Applicant: Resonac Corporation, Tokyo (JP)

(72) Inventors: Chihiro Tamura, Chiba (JP); Kengo Nogami, Chiba (JP); Kazuyuki Yoshino, Chiba (JP)

(73) Assignee: RESONAC HARD DISK CORPORATION, Chiba (JP)

( * ) Notice: Subject to any disclaimer, the term of this patent is extended or adjusted under 35 U.S.C. 154(b) by 444 days.

(21) Appl. No.: 18/502,354

(22) Filed: Nov. 6, 2023

(65) Prior Publication Data

US 2024/0150889 A1 May 9, 2024

(30) Foreign Application Priority Data

Nov. 9, 2022 (JP) ................................ 2022-179481

(51) Int. Cl.
*C23C 14/56* (2006.01)
*B05C 13/00* (2006.01)

(52) U.S. Cl.
CPC ............ *C23C 14/568* (2013.01); *B05C 13/00* (2013.01)

(58) Field of Classification Search
None
See application file for complete search history.

(56) References Cited

U.S. PATENT DOCUMENTS

| | | | | |
|---|---|---|---|---|
| 2,730,987 A | * | 1/1956 | Nelson | H01J 29/28 |
| | | | | 118/704 |
| 4,500,407 A | * | 2/1985 | Boys | C23C 14/56 |
| | | | | 414/217 |
| 4,722,298 A | * | 2/1988 | Rubin | H10P 72/3306 |
| | | | | 414/217 |
| 4,745,297 A | * | 5/1988 | Sullivan | H01J 37/20 |
| | | | | 118/500 |
| 4,795,299 A | * | 1/1989 | Boys | H10P 72/0462 |
| | | | | 414/217 |

(Continued)

FOREIGN PATENT DOCUMENTS

JP          H08-274142          10/1996

*Primary Examiner* — Jethro M. Pence
(74) *Attorney, Agent, or Firm* — IPUSA, PLLC

(57) ABSTRACT

Falling of a substrate and deformation or breakage of the substrate are inhibited. A substrate holder includes a hole portion in which a disk-shaped substrate is placed upright, and at least four supporting members attached elastically-deformably on a periphery of the hole portion. Two of the four supporting members support disk-shaped substrate at first- and second-side circumferential end portions of disk-shaped substrate positioned at vertical-direction upper positions of disk-shaped substrate. Remaining two of the four supporting members support disk-shaped substrate at third- and fourth-side circumferential end portions of disk-shaped substrate positioned at vertical-direction lower positions of disk-shaped substrate. Central angle in disk-shaped substrate between either first- or second-side circumferential end portion and uppermost end portion of disk-shaped substrate is from 15° through 40°. Central angle in disk-shaped substrate between either third- or fourth-side circumferential end portion and lowermost end portion of disk-shaped substrate is from 10° through 15°.

4 Claims, 4 Drawing Sheets

(56)                    References Cited

U.S. PATENT DOCUMENTS

| | | | | | |
|---|---|---|---|---|---|
| 5,024,570 | A * | 6/1991 | Kiriseko | ............. | H10P 72/0456 |
| | | | | | 414/940 |
| 5,076,205 | A * | 12/1991 | Vowles | .............. | H10P 72/0461 |
| | | | | | 414/217 |
| 5,651,823 | A * | 7/1997 | Parodi | ................. | H10P 72/0454 |
| | | | | | 414/940 |
| 6,027,618 | A * | 2/2000 | Aruga | ................... | C23C 14/568 |
| | | | | | 204/192.12 |
| 6,074,538 | A * | 6/2000 | Ohmi | ................... | C23C 14/564 |
| | | | | | 204/298.23 |
| 7,654,221 | B2 * | 2/2010 | Lubomirsky | ....... | H10P 72/7608 |
| | | | | | 118/724 |
| 8,801,858 | B2 * | 8/2014 | Rathweg | ................. | C23C 14/24 |
| | | | | | 118/733 |
| 11,658,058 | B2 * | 5/2023 | Abe | ..................... | C25D 17/001 |
| | | | | | 118/500 |
| 11,776,828 | B2 * | 10/2023 | Sakaue | .............. | H10P 72/0466 |
| | | | | | 118/719 |
| 11,891,685 | B2 * | 2/2024 | Tashiro | ................... | C23C 14/34 |
| 12,529,142 | B2 * | 1/2026 | Neal | ........................ | C23C 14/50 |
| 2005/0061240 | A1 * | 3/2005 | Hashinoki | .......... | H10P 72/3306 |
| | | | | | 118/500 |
| 2011/0168330 | A1 * | 7/2011 | Sakaue | .............. | H10P 72/0434 |
| | | | | | 156/345.31 |
| 2015/0013910 | A1 * | 1/2015 | Krupyshev | ............. | B25J 9/042 |
| | | | | | 118/500 |
| 2022/0388025 | A1 * | 12/2022 | Rock | ........................ | B05C 3/08 |
| 2023/0372964 | A1 * | 11/2023 | Rock | ........................ | B05C 3/08 |

* cited by examiner

1

SUBSTRATE HOLDER, SUBSTRATE HOLDING METHOD, AND FILM FORMATION APPARATUS

CROSS-REFERENCE TO RELATED APPLICATION

The present application is based on and claims priority under 35 U.S.C. § 119 to Japanese Patent Application No. 2022-179481, filed on Nov. 9, 2022, the contents of which are incorporated herein by reference in their entirety.

BACKGROUND OF THE INVENTION

1. Field of the Invention

The present disclosure relates to a substrate holder, a substrate holding method, and a film formation apparatus.

2. Description of the Related Art

Hitherto, a substrate holder and a substrate holding method for holding a substrate by a plurality of supporting members have been known. A film formation apparatus configured to perform a film formation process on a substrate has also been known (for example, see Japanese Laid-Open Patent Application Publication No. 8-274142).

SUMMARY OF THE INVENTION

However, according to Japanese Laid-Open Patent Application Publication No. 8-274142, when the substrate conveying speed is increased in order to increase the productivity of the film formation apparatus, there is a risk of making the substrate more likely to fall due to vibration during conveying or an acceleration applied to the substrate. When the supporting force, which the supporting members exert on the substrate, is increased in order to inhibit falling of the substrate, the substrate is more likely to deform or break.

Hence, in view of the problem described above, an object of the technique of the present disclosure is to inhibit falling of the substrate while also inhibiting deformation or breakage of the substrate.

According to an embodiment of the present disclosure, a substrate holder including: a hole portion in which a disk-shaped substrate is placed upright; and at least four supporting members attached elastically-deformably on a periphery of the hole portion is provided.

Two supporting members of the four supporting members are configured to support the disk-shaped substrate at a first-side circumferential end portion and a second-side circumferential end portion of the disk-shaped substrate that are positioned at vertical-direction upper positions of the disk-shaped substrate.

Remaining two supporting members of the four supporting members are configured to support the disk-shaped substrate at a third-side circumferential end portion and a fourth-side circumferential end portion of the disk-shaped substrate that are positioned at vertical-direction lower positions of the disk-shaped substrate.

Each of a first central angle and a second central angle is in a range of from 15° through 40°, the first central angle being a central angle in the disk-shaped substrate between the first-side circumferential end portion and an uppermost end portion of the disk-shaped substrate that is positioned at a vertical-direction uppermost position of the disk-shaped substrate, and the second central angle being a central angle in the disk-shaped substrate between the second-side circumferential end portion and the uppermost end portion.

Each of a third central angle and a fourth central angle is in a range of from 10° through 15°, the third central angle being a central angle in the disk-shaped substrate between the third-side circumferential end portion and a lowermost end portion of the disk-shaped substrate that is positioned at a vertical-direction lowermost position of the disk-shaped substrate, and the fourth central angle being a central angle in the disk-shaped substrate between the fourth-side circumferential end portion and the lowermost end portion.

According to another embodiment of the present disclosure, a substrate holding method by a substrate holder including: a hole portion in which a disk-shaped substrate is placed upright; and at least four supporting members attached elastically-deformably on a periphery of the hole portion is provided. In the substrate holding method, the substrate holder performs:

supporting the disk-shaped substrate at a first-side circumferential end portion and a second-side circumferential end portion of the disk-shaped substrate by two supporting members of the four supporting members, the first-side circumferential end portion and the second-side circumferential end portion being positioned at vertical-direction upper positions of the disk-shaped substrate; and supporting the disk-shaped substrate at a third-side circumferential end portion and a fourth-side circumferential end portion of the disk-shaped substrate by remaining two supporting members of the four supporting members, the third-side circumferential end portion and the fourth-side circumferential end portion being positioned at vertical-direction lower positions of the disk-shaped substrate.

Each of a first central angle and a second central angle is in a range of from 15° through 40°, the first central angle being a central angle in the disk-shaped substrate between the first-side circumferential end portion and an uppermost end portion of the disk-shaped substrate that is positioned at a vertical-direction uppermost position of the disk-shaped substrate, and the second central angle being a central angle in the disk-shaped substrate between the second-side circumferential end portion and the uppermost end portion.

Each of a third central angle and a fourth central angle is in a range of from 10° through 15°, the third central angle being a central angle in the disk-shaped substrate between the third-side circumferential end portion and a lowermost end portion of the disk-shaped substrate that is positioned at a vertical-direction lowermost position of the disk-shaped substrate, and the fourth central angle being a central angle in the disk-shaped substrate between the fourth-side circumferential end portion and the lowermost end portion.

According to another embodiment of the present disclosure, a film formation apparatus including:

a chamber in which a film formation process is performed on a disk-shaped substrate;

a carrier on which a substrate holder according to an embodiment of the present disclosure is situated, the substrate holder being configured to hold the disk-shaped substrate at least in the chamber; and a conveying mechanism configured to convey the carrier is provided.

According to an embodiment of the present disclosure, it is possible to inhibit falling of a substrate while inhibiting deformation or breakage of the substrate.

3

Figure 1:
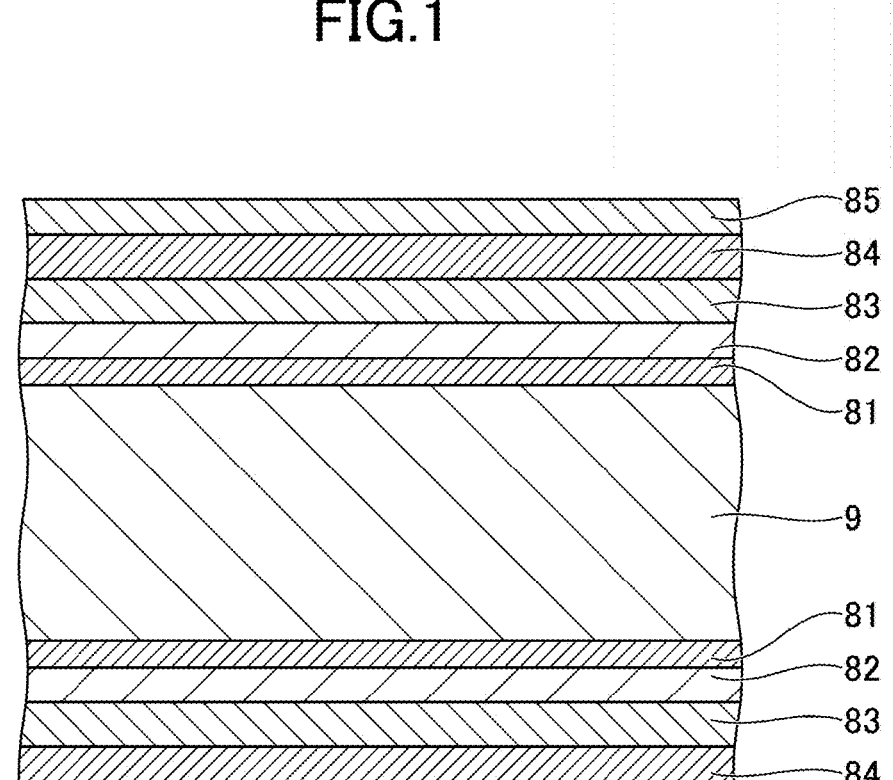
FIG. 1 is a cross-sectional view of an example of a recording medium produced by a film formation apparatus according to an embodiment.

DESCRIPTION OF THE PREFERRED
EMBODIMENTS

An embodiment of the present disclosure will be described in detail below with reference to the drawings. The same components will be denoted by the same reference numerals in the drawings, and overlapping descriptions about them will be omitted where appropriate.
(Magnetic Recording Medium)

First, an example of a recording medium produced by a film formation apparatus according to the present embodiment will be described. FIG. 1 is a cross-sectional view of an example of a recording medium produced by the film formation apparatus according to the present embodiment. The recording medium is, for example, a magnetic recording medium.

In recent years, applicable ranges of magnetic recording apparatuses have significantly expanded and the importance of magnetic recording apparatuses has increased, while the recording density of magnetic recording media used with magnetic recording apparatuses has also been remarkably increasing.

Future magnetic recording media will be required to have an even higher recording density. Hence, magnetic layers are required to have a higher coercivity, a higher signal-to-noise ratio (SNR), and a higher resolution. Moreover, in recent years, efforts have been continuously made to increase the surface recording density by increasing the linear recording density and simultaneously increasing the track density.

Examples of the method for producing a magnetic recording medium include a method of forming, for example, a soft magnetic layer, an intermediate layer, and a recording magnetic layer on a non-magnetic substrate, and then forming a protective layer on the recording magnetic layer.

To the extent possible, it is preferable to continuously perform such a producing method using one film formation apparatus. Performing film formation processes continuously can inhibit contamination of substrates during handling, and can increase the magnetic recording medium productivity by reducing, for example, handling steps and improving the efficiency and the product yield of the production steps.

Hence, when producing such magnetic recording media, it is proposed to use an inline-type film formation apparatus configured to sequentially form, for example, magnetic layers on both surfaces of non-magnetic substrates while conveying a carrier holding a plurality of non-magnetic substrates sequentially from one chamber to another chamber of a plurality of chambers.

In order to increase the magnetic recording medium productivity of the inline-type film formation apparatus, there is a case where the conveying speed of the carrier is increased. However, when the conveying speed of the carrier is increased, substrates are more likely to fall from the carrier due to vibration during conveying or an acceleration applied to the substrates.

When increasing the supporting force exerted by a supporting member to support the substrates in order to inhibit falling of the substrates is excessive, the substrates may deform or break. Particularly, there is a recent years' trend to reduce the thickness of the substrates and increase the number of magnetic recording media to be contained in a case in order to increase the recording capacity of a hard disk device. Reducing the thickness of the substrates reduces the strength of the substrates and makes them more likely to deform or break.

To solve this problem, a substrate holder and a substrate holding method according to the present embodiment inhibit falling of substrates from a carrier even when the conveying speed of the carrier is increased. Moreover, the substrate holder and the substrate holding method inhibit deformation or breakage of substrates at the portions of the substrates supported by supporting members even when the thickness of the substrates is reduced. Moreover, a film formation apparatus according to the present embodiment increases the recording medium productivity by using this substrate holder.

The present embodiment will be described by taking, as an example, a case where magnetic recording media to be mounted on a hard disk device are produced using an inline-type film formation apparatus configured to perform film formation processes while conveying disk-shaped substrates sequentially from a chamber to another chamber of a plurality of chambers.

As illustrated in FIG. 1, a magnetic recording medium produced by an inline-type film formation apparatus according to the present embodiment has a structure including soft magnetic layers 81, intermediate layers 82, recording magnetic layers 83, and protective layers 84 in this order on both surfaces of a disk-shaped substrate 9, and further including lubricating films 85 on the outermost surfaces.

As the disk-shaped substrate 9, an Al alloy substrate made of, for example, an Al—Mg alloy mainly containing Al, or a typical substrate made of, for example, soda glass, aluminosilicate-based glass, various types of crystallized glass, silicon, titanium, ceramics, and various types of resins is used. That is, a desirably selected substrate can be used as the disk-shaped substrate 9 so long as it is a non-magnetic substrate.
(Inline-Type Film Formation Apparatus)

Figure 2:
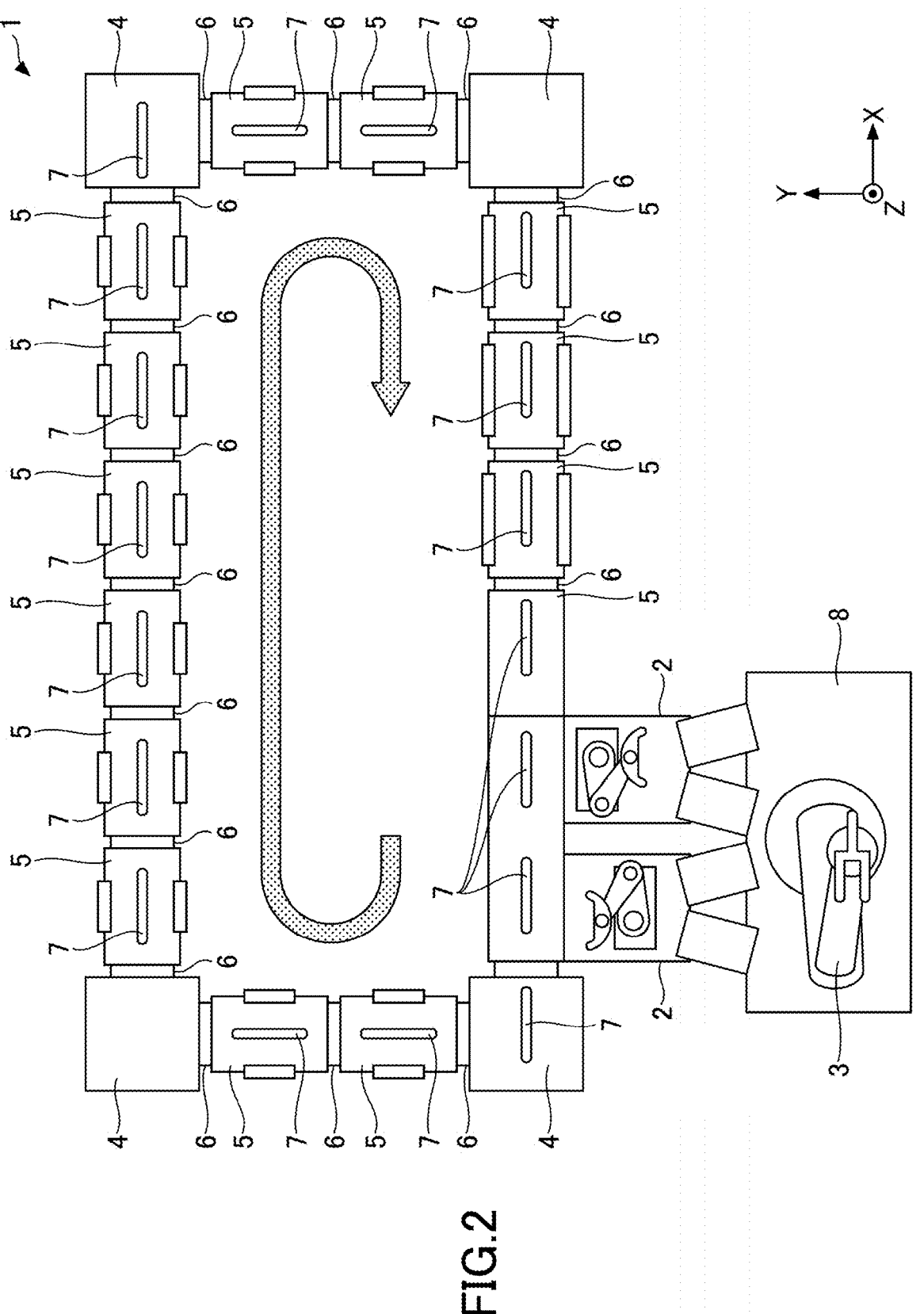
FIG. 2 is a plan view of a film formation apparatus according to an embodiment.

FIG. 2 is a plan view of an inline-type film formation apparatus 1 according to the present embodiment. When producing a magnetic recording medium, at least soft magnetic layer 81, intermediate layers 82, recording magnetic layers 83, and protective layers 84 are laminated in this order on both surfaces of the disk-shaped substrate 9, which is the target on which films are formed, using, for example, the inline-type film formation apparatus 1 as illustrated in FIG. 2. Through these steps, magnetic recording media can be obtained at a high productivity.

Specifically, the inline-type film formation apparatus 1 according to the present embodiment includes a robot table 8, a substrate cassette transferring/placing robot 3 placed on the robot table 8, a substrate attaching/detaching robot 2 adjacent to the robot table 8, and a plurality of corner chambers 4 in which a carrier 7 is rotated. The inline-type film formation apparatus 1 also includes a plurality of chambers 5 positioned between a corner chamber 4 and a corner chamber 4, a plurality of carriers 7 to be conveyed through the plurality of corner chambers 4 and the plurality of chambers 5, and a conveying mechanism 11 configured to convey the plurality of carriers 7.

Gate valves 6 are situated at coupling portions between the chambers 5. When the gate valves 6 are closed, the interiors of the chambers become tightly closed spaces independent from each other.

Non-illustrated vacuum pumps are coupled to the respective chambers 5. The plurality of carriers 7 are sequentially conveyed by the conveying mechanism 11 into the chambers 5 that are depressurized by operations of the vacuum pumps. While the plurality of carriers 7 are sequentially conveyed, soft magnetic layers 81, intermediate layers 82, recording magnetic layers 83, and protective layers 84 are formed in this order on both surfaces of disk-shaped substrates 9 held on the carriers 7 in the respective chambers 5. Subsequently, the substrates are taken out from the inline-type film formation apparatus 1, lubricating films 85 are formed on both surfaces of the substrates, and magnetic recording media illustrated in FIG. 1 are obtained ultimately. The corner chambers 4 are chambers in which the travelling direction of the carriers 7 is changed. A mechanism configured to rotate the carrier 7 and transfer the carrier 7 to the next chamber 5 is situated inside the corner chamber 4.

Figure 3:
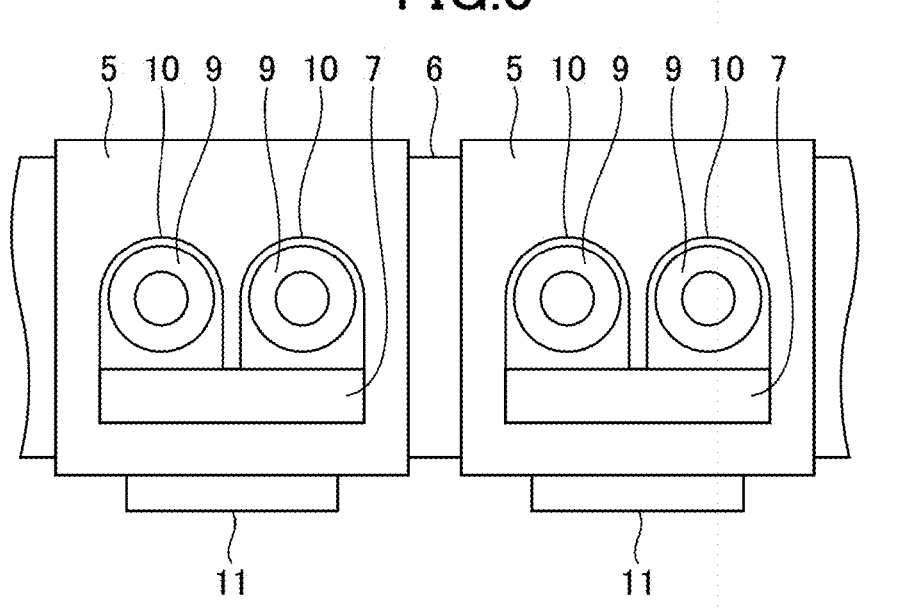
FIG. 3 is a cross-sectional side view of a chamber of a film formation apparatus according to an embodiment.

FIG. 3 is a cross-sectional side view of the chamber 5 of the film formation apparatus according to the present embodiment. The inline-type film formation apparatus 1 includes a contactlessly driving-linear motor driving mechanism as the conveying mechanism 11 configured to convey the carrier 7. As the linear motor driving mechanism, a plurality of magnets are situated in lower portions of the carriers 7 such that N poles and S poles are arranged alternately, and rotating magnets on which N poles and S poles are arranged spirally and alternately are situated below the magnets of the carriers 7 via a partition wall and along a conveying path. The linear motor driving mechanism conveys the carriers 7 by rotating the rotating magnets about their axes while magnetically coupling the magnets on the carriers 7 side and the rotating magnets contactlessly.

(Method for Producing Magnetic Recording Medium)

A method for producing a magnetic recording medium using the inline-type film formation apparatus 1 according to the present embodiment will be described with reference to FIG. 1. The inline-type film formation apparatus 1 produces a magnetic recording medium by conveying a disk-shaped substrate 9 held on the carrier 7 sequentially from the chamber 5 to another chamber 5 of the plurality of chambers 5, and laminating soft magnetic layers 81, intermediate layers 82, recording magnetic layers 83, and protective layers 84 in this order on both surfaces of the disk-shaped substrate 9.

According to the method for producing a magnetic recording medium and the inline-type film formation apparatus 1 described above, it is possible to continuously perform formation of the soft magnetic layers 81 to the protective layers 84 using one apparatus, and the disk-shaped substrate 9, which is the target on which films are formed, is not contaminated during handling of the disk-shaped substrate 9. Moreover, the inline-type film formation apparatus 1 can improve the efficiency of the production steps by reducing, for example, handling steps, improve the product yield, and increase the magnetic recording medium productivity.

(Substrate Holder and Substrate Holding Method)

Figure 4:
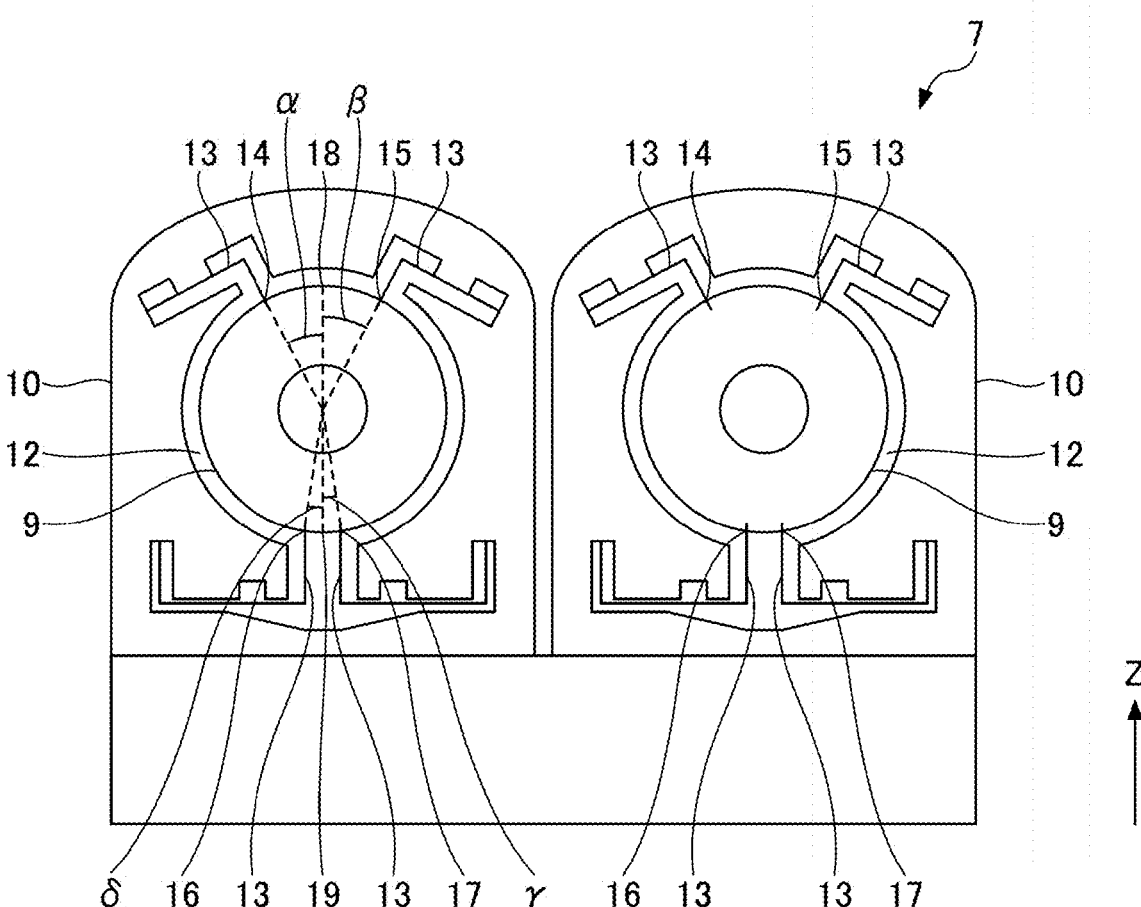
FIG. 4 is a side view of a carrier of a film formation apparatus according to an embodiment.

FIG. 4 is a side view of the carrier 7 used in the inline-type film formation apparatus 1 according to the present embodiment. The carrier 7 according to the present embodiment will be described in greater detail with reference to FIG. 4. The carrier 7 includes two substrate holders 10 each configured to hold a disk-shaped substrate 9 upright. "Upright" means a state in which a main surface (an external surface or a back surface) of the disk-shaped substrate 9 is in parallel with the direction of gravity. In the carrier 7, the two substrate holders 10 are arranged in one line in the conveying direction.

The substrate holder 10 has a thickness that is approximately from one through a few times greater than the thickness of the disk-shaped substrate 9. A circular-shaped hole portion 12 having a diameter greater than that of the disk-shaped substrate 9 is bored in the substrate holder 10 such that a radial-direction gap of approximately 10 mm is formed from the circumferential end of the disk-shaped substrate 9 that is held.

A plurality of supporting members 13 are attached elastically-deformably on the periphery of the hole portion 12 of each substrate holder 10. The plurality of supporting members 13 are situated on the periphery of the hole portion 12 of the substrate holder 10 such that they support the circumferential end of the disk-shaped substrate 9 at specific positions while the disk-shaped substrate 9 is positioned within the hole portion 12.

The substrate holder 10 can hold the circumferential end of the disk-shaped substrate 9, and can hold the disk-shaped substrate 9 framed in the supporting members 13 in a detachably attachable manner. Attaching/detaching of the disk-shaped substrate 9 onto/from the substrate holder 10 is performed by, for example, vertically lower-side two supporting members 13 of the substrate holder 10 being pushed downward by the substrate attaching/detaching robot 2.

The supporting members 13 are, for example, plate spring members bent in an L-letter shape. A base end of each supporting member 13 is fixed on the body of the substrate holder 10. A forefront end of each supporting member 13 is positioned in the gap formed at the periphery of the hole portion 12 of the substrate holder 10, and projects from the gap radially inward into the hole portion 12. For example, a groove portion having a V-letter shape or a U-letter shape and engageable with the circumferential end of the disk-shaped substrate 9 is provided in the forefront end of the supporting member 13 in order to inhibit falling of the disk-shaped substrate 9.

For the supporting members 13, a heat-resistant alloy mainly containing any of, for example, iron, nickel, cobalt, molybdenum, and tungsten may be used. The supporting force exerted by the supporting members 13 on the disk-shaped substrate 9 may be appropriately selected in accordance with, for example, the material and the thickness of the disk-shaped substrate 9, yet is in the range of, for example, from 2 N through 6 N.

The substrate holder 10 according to the present embodiment is equipped with at least four supporting members 13 attached elastically-deformably on the periphery of the hole portion 12. By the four supporting members 13 supporting a first-side circumferential end portion 14, a second-side circumferential end portion 15, a third-side circumferential end portion 16, and a fourth-side circumferential end portion 17 of the disk-shaped substrate 9 respectively, the substrate holder 10 holds the disk-shaped substrate 9 within the hole portion 12. The first-side circumferential end portion 14, the second-side circumferential end portion 15, the third-side circumferential end portion 16, and the fourth-side circumferential end portion 17 of the disk-shaped substrate 9 include either or both of the circumferential surface of the disk-shaped substrate 9 and the circumferential edge (or corner) of the disk-shaped substrate 9.

Here, two supporting members 13 of the four supporting members 13 support the first-side circumferential end portion 14 that is positioned at a vertical-direction upper position of the disk-shaped substrate 9, and the second-side circumferential end portion 15 that is positioned at a vertical-direction upper position of the disk-shaped substrate 9. The first-side circumferential end portion 14 is positioned on a horizontal-direction left-hand-side position of the disk-shaped substrate 9 (or at a right-hand-side position when FIG. 4 is seen from the back). The second-side circumferential end portion 15 is positioned at a horizontal-direction right-hand-side position of the disk-shaped substrate 9 (or at a left-hand-side position when FIG. 4 is seen from the back).

The remaining two supporting members 13 of the four supporting members 13 support the third-side circumferential end portion 16 that is positioned at a vertical-direction lower position of the disk-shaped substrate 9, and the fourth-side circumferential end portion 17 that is positioned at a vertical-direction lower position of the disk-shaped substrate 9. The third-side circumferential end portion 16 is positioned at a horizontal-direction left-hand-side position of the disk-shaped substrate 9 (or at a right-hand-side position when FIG. 4 is seen from the back). The fourth-side circumferential end portion 17 is positioned at a horizontal-direction right-hand-side position of the disk-shaped substrate 9 (or at a left-hand-side position when FIG. 4 is seen from the back).

A first central angle $\alpha$ in the disk-shaped substrate 9 between the first-side circumferential end portion 14 positioned at a vertical-direction upper position of the disk-shaped substrate 9 and an uppermost end portion 18 positioned at a vertical-direction uppermost position of the disk-shaped substrate 9 is in a range of from 15° through 40°, and more preferably in a range of from 16° through 25°. A second central angle $\beta$ in the disk-shaped substrate 9 between the second-side circumferential end portion 15 positioned at a vertical-direction upper position of the disk-shaped substrate 9 and the uppermost end portion 18 positioned at the vertical-direction uppermost position of the disk-shaped substrate 9 is in a range of from 15° through 40°, and more preferably in a range of from 16° through 25°.

A third central angle $\delta$ in the disk-shaped substrate 9 between the third-side circumferential end portion 16 positioned at a vertical-direction lower position of the disk-shaped substrate 9 and a lowermost end portion 19 positioned at a vertical-direction lowermost position of the disk-shaped substrate 9 is in a range of from 10° through 15°. A fourth central angle $\gamma$ in the disk-shaped substrate 9 between the fourth-side circumferential end portion 17 positioned at a vertical-direction lower position of the disk-shaped substrate 9 and the lowermost end portion 19 positioned at the vertical-direction lowermost position of the disk-shaped substrate 9 is in a range of from 10° through 15°.

That is, both of the first central angle $\alpha$ and the second central angle $\beta$ in the disk-shaped substrate 9 are greater than or equal to the third central angle $\delta$ in the disk-shaped substrate 9 and greater than or equal to the fourth central angle $\gamma$ in the disk-shaped substrate 9.

It is preferable that the supporting members 13 are excluded from supporting the disk-shaped substrate 9 at any portions of the disk-shaped substrate 9 that are outside the first central angle $\alpha$ range and the second central angle $\beta$ range of from 15° through 40° in the disk-shaped substrate

9 and the third central angle $\delta$ range and the fourth central angle $\gamma$ range of from 10° through 15° in the disk-shaped substrate 9.

Use of the substrate holder 10 including these supporting members 13 inhibits falling of the disk-shaped substrate 9 from the carrier 7 even when the conveying speed of the carrier 7 is increased, and inhibits deformation of the portions of the disk-shaped substrate 9 supported by the supporting members 13. Hence, the inline-type film formation apparatus 1 can increase the magnetic recording medium productivity. Moreover, it is possible to provide an inline-type film formation apparatus 1 that can accommodate reduction of the substrate thickness, because it is expected that deformation of the disk-shaped substrate 9 will be inhibited.

The reason why the present embodiment has such workings and effects is considered as follows. When the conveying speed of the carrier 7 is increased, a strong vibration and a strong acceleration are applied to the disk-shaped substrate 9. The vibration and acceleration applied to the disk-shaped substrate 9 have particularly strong components in the direction parallel with the travelling direction of the carrier 7, and these components are the cause of falling or deformation of the substrate. Hence, by supporting the disk-shaped substrate 9 at specific portions near the uppermost end portion 18 and the lowermost end portion 19 of the disk-shaped substrate 9, it is possible to alleviate the force applied in the travelling direction of the carrier 7, and to inhibit falling of the disk-shaped substrate 9. Moreover, by the supporting members 13 being excluded from supporting the disk-shaped substrate 9 at any portions other than the specific portions near the uppermost end portion 18 and the lowermost end portion 19 of the disk-shaped substrate 9, it is possible to inhibit deformation of the disk-shaped substrate 9.

On the other hand, when the two supporting members 13 support the first-side circumferential end portion 14 and the second-side circumferential end portion 15 of the disk-shaped substrate 9 in a first central angle $\alpha$ range and a second central angle $\beta$ range that are smaller than 15° in the disk-shaped substrate 9, the force exerted by the substrate holder 10 to hold the disk-shaped substrate 9 decreases, making the disk-shaped substrate 9 likely to fall from the substrate holder 10.

When the two supporting members 13 support the first-side circumferential end portion 14 and the second-side circumferential end portion 15 of the disk-shaped substrate 9 in a first central angle $\alpha$ range and a second central angle $\beta$ range that are greater than 40° in the disk-shaped substrate 9, the portions of the disk-shaped substrate 9 supported by the two supporting members 13 are likely to deform.

Moreover, when the remaining two supporting members 13 support the third-side circumferential end portion 16 and the fourth-side circumferential end portion 17 of the disk-shaped substrate 9 in a third central angle $\delta$ range and a fourth central angle $\gamma$ range that are smaller than 10° in the disk-shaped substrate 9, the force exerted by the substrate holder 10 to hold the disk-shaped substrate 9 decreases, making the disk-shaped substrate 9 likely to fall from the substrate holder 10.

When the remaining two supporting members 13 support the third-side circumferential end portion 16 and the fourth-side circumferential end portion 17 of the disk-shaped substrate 9 in a third central angle $\delta$ range and a fourth central angle $\gamma$ range that are greater than 15° in the disk-shaped substrate 9, the portions of the disk-shaped substrate 9 supported by the supporting members 13 are likely to deform.

Figure 5:
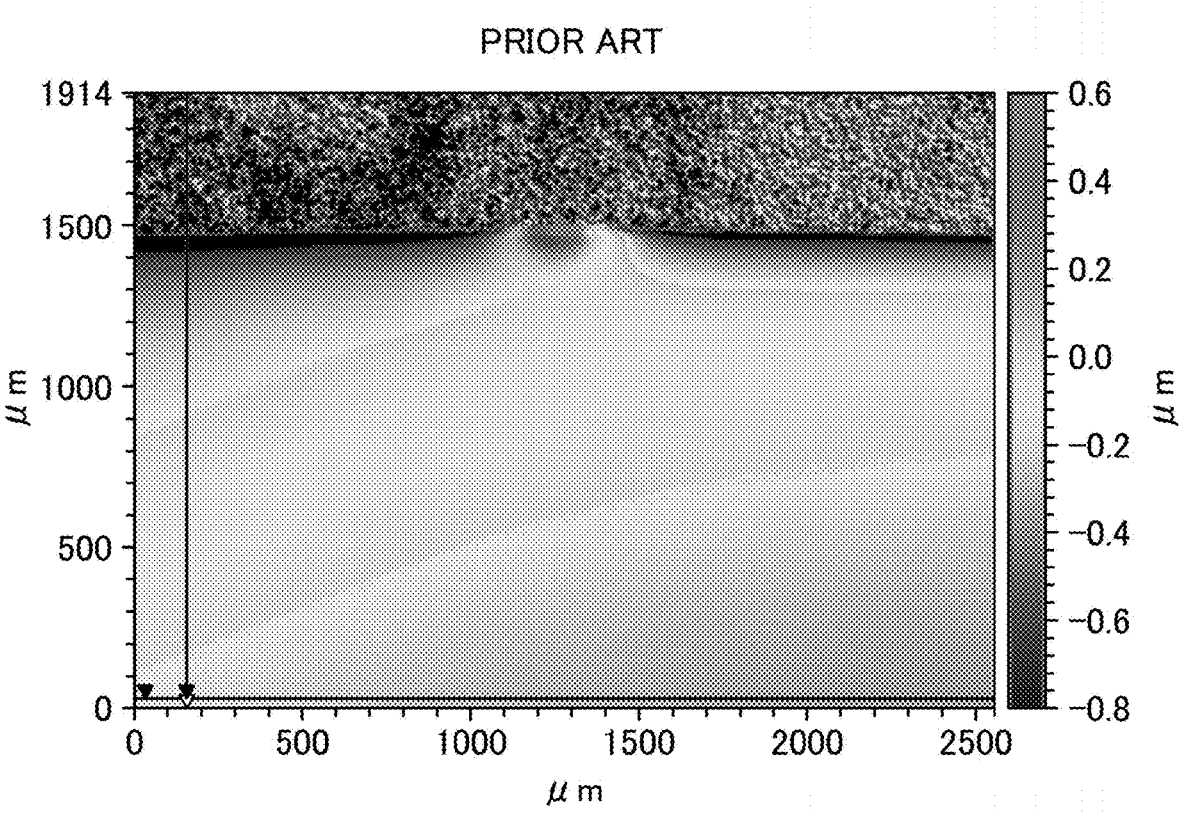
FIG. 5 is a microscopic view (a photograph as a replacement for a drawing) illustrating an example of deformation that occurred in a substrate due to a prior art.

Deformation of the disk-shaped substrate 9 problematized in the present disclosure includes deformation that is difficult to discern by naked eye. FIG. 5 is a microscopic view (a photograph as a replacement for a drawing) illustrating an example of deformation that occurred in a substrate due to a prior art. Deformation in the substrate is a dent resulting from plastic deformation due to the supporting force of supporting members provided on an existing substrate holder. The dent has a height of 1.26 μm, and a width of 180.15 μm from the outermost circumferential end of the substrate. In recent years, the recording region of magnetic recording media has expanded to the circumferential end in order to meet the demand for an increased recording capacity of hard disk devices. Hence, it has become common to determine that even a minute dent that cannot be discerned by naked eye as illustrated in FIG. 5 is a defective portion.

The workings and effects of the substrate holder 10 and the inline-type film formation apparatus 1 according to the present embodiment will be more clarified below by way of Examples. The substrate holder 10 and the inline-type film formation apparatus 1 according to the present embodiment should not be construed as being limited to the Examples below, and may be carried out in appropriately modified manners within the scope of the spirit.

Example 1

In Example 1, using the inline-type film formation apparatus 1 illustrated in FIG. 2 and the carrier 7 illustrated in alloy as recording magnetic layers 83 were deposited on both surfaces of the disk-shaped substrate 9. Moreover, using an ion beam method, hard carbon films as protective layers 84 were deposited on the recording magnetic layers 83.

The upper two supporting members 13 of the substrate holder 10 supported the first-side circumferential end portion 14 and the second-side circumferential end portion 15 of the disk-shaped substrate 9 at positions of the disk-shaped substrate 9 defined by a first central angle α and a second central angle β of 20°, respectively. The lower two supporting members 13 of the substrate holder 10 supported the third-side circumferential end portion 16 and the fourth-side circumferential end portion 17 of the disk-shaped substrate 9 at positions of the disk-shaped substrate 9 defined by a third central angle γ and a fourth central angle δ of 13°, respectively.

The conveying speed of the carrier 7 between a chamber 5 and a chamber 5 was 1.2 m/sec, and the acceleration during speed increase or decrease was 6 m/sec$^2$.

One thousand magnetic recording media were produced under the conditions described above, and falling of disk-shaped substrates 9 did not occur.

Presence or absence of deformation (dent) in the circumferential end of the produced magnetic recording media was determined based on a differential interference contrast microscope image. When a deformation having a width of 100 μm or greater from the circumferential end of a magnetic recording medium and a height of 0.5 μm or greater was observed, it was determined that a dent was present. The results are presented in Table 1.

TABLE 1

| | α (°) | β (°) | γ (°) | δ (°) | Conveying speed (m/sec) | Acceleration during speed increase/decrease (m/sec²) | Substrate thickness (mm) | Dent occurring rate (%) | Presence or absence of substrate fall | Whether productivity was high or low |
|---|---|---|---|---|---|---|---|---|---|---|
| Ex. 1 | 20 | 20 | 13 | 13 | 1.2 | 6 | 0.8 | 0 | Absent | High |
| Ex. 2 | 40 | 40 | 13 | 13 | 1.2 | 6 | 0.8 | 0 | Absent | High |
| Ex. 3 | 15 | 15 | 13 | 13 | 1.2 | 6 | 0.8 | 0 | Absent | High |
| Ex. 4 | 20 | 20 | 10 | 10 | 1.2 | 6 | 0.8 | 0 | Absent | High |
| Ex. 5 | 20 | 20 | 15 | 15 | 1.2 | 6 | 0.8 | 0 | Absent | High |
| Comp. Ex. 1 | 50 | 50 | 13 | 13 | 1.2 | 6 | 0.8 | 1.4 | Absent | High |
| Comp. Ex. 2 | 10 | 10 | 13 | 13 | 1.2 | 6 | 0.8 | — | Present | High |
| Comp. Ex. 3 | 50 | 50 | 13 | 13 | 0.6 | 3 | 0.8 | 0 | Absent | Low |
| Comp. Ex. 4 | 10 | 10 | 13 | 13 | 0.6 | 3 | 0.8 | 0 | Absent | Low |
| Comp. Ex. 5 | 40 | 40 | 8 | 8 | 1.2 | 6 | 0.8 | — | Present | High |
| Comp. Ex. 6 | 40 | 40 | 18 | 18 | 1.2 | 6 | 0.8 | 0.9 | Absent | High |
| Ex. 6 | 20 | 20 | 13 | 13 | 1.8 | 6 | 0.6 | 0 | Absent | High |
| Ex. 7 | 40 | 40 | 13 | 13 | 1.8 | 6 | 0.6 | 0.3 | Absent | High |
| Comp. Ex. 7 | 50 | 50 | 13 | 13 | 1.8 | 6 | 0.6 | 5.5 | Absent | High |
| Ex. 8 | 20 | 20 | 13 | 13 | 1.8 | 6 | 0.5 | 0 | Absent | High |
| Ex. 9 | 40 | 40 | 13 | 13 | 1.8 | 6 | 0.5 | 0.5 | Absent | High |
| Comp. Ex. 8 | 50 | 50 | 13 | 13 | 1.8 | 6 | 0.5 | 6.5 | Absent | High |

FIG. 4, a magnetic recording medium was produced from a disk-shaped substrate 9 made of an aluminum alloy and having an outer diameter of 96 mm, an inner diameter of 25 mm, and a thickness of 0.8 mm. Specifically, using a DC sputtering method, FeCoB alloy as soft magnetic layers 81, Ru as intermediate layers 82, and a 70Co-5Cr-15Pt-10SiO$_2$

Examples 2 to 9 and Comparative Examples 1 to 8

In Examples 2 to 9 and Comparative Examples 1 to 8, magnetic recording media were produced in the same manner as in Example 1, and presence or absence of falling of disk-shaped substrates 9 and presence or absence of dents were confirmed. However, the first central angle α, the second central angle β, the third central angle γ, and the fourth central angle δ indicating the positions of the disk-shaped substrate 9 to be supported by the supporting members 13 were changed as presented in Table 1. The conveying speed of the carrier 7, the acceleration during speed increase or decrease of the carrier 7, and the thickness of the disk-shaped substrate 9 were changed as presented in Table 1. The results are presented in Table 1. In the cases where the conveying speed of the carrier between a chamber 5 and a chamber 5 was 0.6 m/sec and the acceleration during speed increase or decrease was 3 m/sec², the productivity was determined to be low because the production capacity of the film formation apparatus decreased by 10%.

As indicated by Example 2 in which the first central angle α and the second central angle β in the disk-shaped substrate 9 defining the positions to be supported by the upper two supporting members 13 of the substrate holder 10 were both changed to 40° from Example 1, no dent occurred and no falling of substrates occurred.

As indicated by Example 3 in which the first central angle α and the second central angle β in the disk-shaped substrate 9 defining the positions to be supported by the upper two supporting members 13 of the substrate holder 10 were both changed to 15° from Example 1, no dent occurred and no falling of substrates occurred.

As indicated by Example 4 in which the third central angle γ and the fourth central angle δ in the disk-shaped substrate 9 defining the positions to be supported by the lower two supporting members 13 of the substrate holder 10 were both changed to 10° from Example 1, no dent occurred and no falling of substrates occurred.

As indicated by Example 5 in which the third central angle γ and the fourth central angle δ in the disk-shaped substrate 9 defining the positions to be supported by the lower two supporting members 13 of the substrate holder 10 were both changed to 15° from Example 1, no dent occurred and no falling of substrates occurred.

As indicated by Comparative Example 1 in which the first central angle α and the second central angle β in the disk-shaped substrate 9 defining the positions to be supported by the upper two supporting members 13 of the substrate holder 10 were both changed to 50° from Example 1, dents occurred in 1.4% of the substrates.

As indicated by Comparative Example 2 in which the first central angle α and the second central angle β in the disk-shaped substrate 9 defining the positions to be supported by the upper two supporting members 13 of the substrate holder 10 were both changed to 10° from Example 1, falling of substrates occurred.

As indicated by Comparative Example 3 in which the conveying speed of the carrier 7 was decreased to 0.6 m/sec from Comparative Example 1, no dent occurred and no falling of substrates occurred, but the productivity of the film formation apparatus decreased because the production capacity of the film formation apparatus decreased by 10%.

As indicated by Comparative Example 4 in which the first central angle α and the second central angle β in the disk-shaped substrate 9 defining the positions to be supported by the upper two supporting members 13 of the substrate holder 10 were both changed to 10° from Comparative Example 3, the results were the same as in Comparative Example 3.

As indicated by Comparative Example 5 in which the third central angle γ and the fourth central angle δ in the disk-shaped substrate 9 defining the positions to be supported by the lower two supporting members 13 of the substrate holder 10 were both changed to 8° from Example 2, falling of substrates occurred.

As indicated by Comparative Example 6 in which the third central angle γ and the fourth central angle δ in the disk-shaped substrate 9 defining the positions to be supported by the lower two supporting members 13 of the substrate holder 10 were both changed to 18° from Example 2, dents occurred in 0.9% of the substrates.

As indicated by Example 6 in which the conveying speed of the carrier 7 was increased to 1.8 m/sec and the thickness of the disk-shaped substrate 9 was reduced to 0.6 mm from Example 1, no dent occurred and no falling of substrates occurred.

As indicated by Example 7 in which the first central angle α and the second central angle β in the disk-shaped substrate 9 defining the positions to be supported by the upper two supporting members 13 of the substrate holder 10 were both changed to 40° from Example 6, dents occurred in 0.3% of the substrates but were tolerable levels, and no falling of substrates occurred.

As indicated by Comparative Example 7 in which the first central angle α and the second central angle β in the disk-shaped substrate 9 defining the positions to be supported by the upper two supporting members 13 of the substrate holder 10 were both changed to 50° from Example 6, the dent occurring rate steeply increased to 5.5%.

As indicated by Example 8 in which the thickness of the disk-shaped substrate 9 was further reduced to 0.5 mm from Example 6, no dent occurred and no falling of substrates occurred.

As indicated by Example 9 in which the thickness of the disk-shaped substrate 9 was further reduced to 0.5 mm from Example 7, dents occurred in 0.5% of the substrates but were tolerable levels, and no falling of substrates occurred.

As indicated by Comparative Example 8 in which the first central angle α and the second central angle β in the disk-shaped substrate 9 defining the positions to be supported by the upper two supporting members 13 of the substrate holder 10 were both changed to 50° from Example 7, the dent occurring rate steeply increased to 6.5%.

From the above experimental data, it was found preferable to set the first central angle α and the second central angle β in the disk-shaped substrate 9 that define the positions to be supported by the upper two supporting members 13 of the substrate holder 10 in the range of from 15° through 40°, more preferably in the range of from 16° through 25°.

It was also found preferable to set the third central angle γ and the fourth central angle δ in the disk-shaped substrate 9 that define the positions to be supported by the lower two supporting members 13 of the substrate holder 10 in the range of from 10° through 15°.

(Workings and Effects)

The substrate holder and the substrate holding method according to the present embodiment can inhibit falling of the disk-shaped substrate 9 from the substrate holder 10 even when the conveying speed of the carrier 7 is increased. Moreover, even when the thickness of the disk-shaped substrate 9 is reduced, it is possible to inhibit deformation of the disk-shaped substrate 9 at the portions of the disk-shaped substrate 9 supported by the supporting members 13. This makes it possible to provide an inline-type film formation apparatus 1 having a high productivity. Moreover, it is possible to provide an inline-type film formation apparatus 1 that can accommodate reduction of the thickness of the disk-shaped substrate 9, because it is expected that deformation of the disk-shaped substrate 9 will be inhibited.

The preferred embodiment has been described in detail above. However, the embodiment described above is non-limiting, and various modifications and replacements are applicable to the embodiment described above without departing from the scope described in the claims. For example, the film formation apparatus including the substrate holder according to the present disclosure is not limited to the inline-type film formation apparatus 1, but the disclosure is also applicable to, for example, a batch-type film formation apparatus. Moreover the number of the supporting members 13 is not limited so long as the number is 4 or greater.

All of the numerals such as ordinal numbers and quantities used in the description of the embodiment described above have been presented as examples for concretely describing the technique of the present disclosure, and the present disclosure is not limited to the numerals presented as examples. The connection relationship between the components has been presented as an example for concretely describing the technique of the present disclosure, and the connection relationship for realizing the functions of the present disclosure is not limited to this.

What is claimed is:

1. A substrate holder, comprising:

a hole portion in which a disk-shaped substrate is placed upright; and at least four supporting members attached elastically-deformably on a periphery of the hole portion, wherein two supporting members of the four supporting members are configured to support the disk-shaped substrate at a first-side circumferential end portion and a second-side circumferential end portion of the disk-shaped substrate that are positioned at vertical-direction upper positions of the disk-shaped substrate, remaining two supporting members of the four supporting members are configured to support the disk-shaped substrate at a third-side circumferential end portion and a fourth-side circumferential end portion of the disk-shaped substrate that are positioned at vertical-direction lower positions of the disk-shaped substrate, each of a first central angle and a second central angle is in a range of from 15° through 40°, the first central angle being a central angle in the disk-shaped substrate between the first-side circumferential end portion and an uppermost end portion of the disk-shaped substrate that is positioned at a vertical-direction uppermost position of the disk-shaped substrate, and the second central angle being a central angle in the disk-shaped substrate between the second-side circumferential end portion and the uppermost end portion, and each of a third central angle and a fourth central angle is in a range of from 10° through 15°, the third central angle being a central angle in the disk-shaped substrate between the third-side circumferential end portion and a lowermost end portion of the disk-shaped substrate that is positioned at a vertical-direction lowermost position of the disk-shaped substrate, and the fourth central angle being a central angle in the disk-shaped substrate between the fourth-side circumferential end portion and the lowermost end portion.

2. The substrate holder according to claim 1, wherein the supporting members are excluded from supporting the disk-shaped substrate at any portions of the disk-shaped substrate that are outside the range of from 15° through 40° and from the range of from 10° through 15°, the range of from 15° through 40° being defined by the first central angle and the second central angle, and the range of from 10° through 15° being defined by the third central angle and the fourth central angle.

3. A substrate holding method by a substrate holder including: a hole portion in which a disk-shaped substrate is placed upright; and at least four supporting members attached elastically-deformably on a periphery of the hole portion, the substrate holding method comprising the substrate holder performing:

supporting the disk-shaped substrate at a first-side circumferential end portion and a second-side circumferential end portion of the disk-shaped substrate by two supporting members of the four supporting members, the first-side circumferential end portion and the second-side circumferential end portion being positioned at vertical-direction upper positions of the disk-shaped substrate; and supporting the disk-shaped substrate at a third-side circumferential end portion and a fourth-side circumferential end portion of the disk-shaped substrate by remaining two supporting members of the four supporting members, the third-side circumferential end portion and the fourth-side circumferential end portion being positioned at vertical-direction lower positions of the disk-shaped substrate, wherein each of a first central angle and a second central angle is in a range of from 15° through 40°, the first central angle being a central angle in the disk-shaped substrate between the first-side circumferential end portion and an uppermost end portion of the disk-shaped substrate that is positioned at a vertical-direction uppermost position of the disk-shaped substrate, and the second central angle being a central angle in the disk-shaped substrate between the second-side circumferential end portion and the uppermost end portion, and each of a third central angle and a fourth central angle is in a range of from 10° through 15°, the third central angle being a central angle in the disk-shaped substrate between the third-side circumferential end portion and a lowermost end portion of the disk-shaped substrate that is positioned at a vertical-direction lowermost position of the disk-shaped substrate, and the fourth central angle being a central angle in the disk-shaped substrate between the fourth-side circumferential end portion and the lowermost end portion.

4. A film formation apparatus, comprising:

a chamber in which a film formation process is performed on a disk-shaped substrate;

a carrier on which the substrate holder of claim 1 is situated, the substrate holder being configured to hold the disk-shaped substrate at least in the chamber; and a conveying mechanism configured to convey the carrier.

* * * * *